(12) United States Patent
Kuo et al.

(10) Patent No.: US 6,516,814 B2
(45) Date of Patent: Feb. 11, 2003

(54) METHOD OF RAPID PREVENTION OF PARTICLE POLLUTION IN PRE-CLEAN CHAMBERS

(75) Inventors: Chia-ming Kuo, Hsin-chu (TW); Chao-yuan Huang, Hsin-chu (TW)

(73) Assignee: Silicon Integrated Systems Corp., Hsin-chu (TW)

( * ) Notice: Subject to any disclaimer, the term of this patent is extended or adjusted under 35 U.S.C. 154(b) by 86 days.

(21) Appl. No.: 09/847,319

(22) Filed: May 3, 2001

(65) Prior Publication Data

US 2002/0162569 A1 Nov. 7, 2002

(51) Int. Cl.$^7$ ................................................. B08B 7/04
(52) U.S. Cl. ..................... 134/1.1; 134/22.1; 118/723 I
(58) Field of Search .............................. 134/1, 1.1, 1.2, 134/22.1, 22.18, 26, 30, 902, 11; 118/715, 723 R, 723 I; 204/192.35, 192.37; 438/905

(56) References Cited

U.S. PATENT DOCUMENTS

| | | | |
|---|---|---|---|
| 5,812,403 A | * | 9/1998 | Fong et al. .................... 134/1.1 |
| 5,968,587 A | * | 10/1999 | Frankel ....................... 219/390 |
| 6,019,848 A | * | 2/2000 | Frankel et al. ............... 118/715 |
| 6,067,999 A | * | 5/2000 | Hines et al. ..................... 134/1 |
| 6,121,161 A | * | 9/2000 | Rossman et al. ............ 438/783 |
| 6,139,702 A | * | 10/2000 | Yang et al. ............. 204/192.35 |
| 6,223,685 B1 | * | 5/2001 | Gupta et al. ............. 118/723 E |
| 6,348,099 B1 | * | 2/2002 | Xia et al. ..................... 118/684 |

FOREIGN PATENT DOCUMENTS

JP 11269644 A * 10/1999 ............ C23C/14/34

* cited by examiner

*Primary Examiner*—Alexander Markoff
(74) *Attorney, Agent, or Firm*—Birch, Stewart, Kolasch & Birch, LLP

(57) ABSTRACT

A method for rapid preventing particles in a pre-clean chamber according to the invention includes a silica material supply step for providing a silica material in the pre-clean chamber, a gas supply step for providing oxygen gas and sputtering gas into the pre-clean chamber, and a plasma generating step for ionizing the oxygen gas and the sputtering gas by RF to form plasma and then impacting the plasma onto the silica material, so that the silica dislodged from the silica material and it reacts with the ionized oxygen at a time so as to form a silicon oxide layer rapidly on the bell-jar in the pre-clean chamber. The method of the invention prevents the silicon-rich oxide from peeling quickly so as to extend the life of the bell-jar.

7 Claims, 5 Drawing Sheets

METHOD OF RAPID PREVENTION OF PARTICLE POLLUTION IN PRE-CLEAN CHAMBERS

BACKGROUND OF INVENTION

1. Field of Invention

The invention relates to a method for rapid preventing particles in a pre-clean chamber and, more particularly, to a method for rapid preventing particles in a pre-clean chamber of a physical vapor deposition (PVD) device.

2. Related Art

In a conventional semi-conductor manufacturing procedure, a PVD device is used to execute a metallic film plating procedure. As shown in FIG. 1, a conventional PVD device includes a buffer chamber 1, a pre-clean chamber 2, a transfer chamber 3, a process chamber 4 and a robot arm 5. The pre-clean chamber 2 is employed to execute a wafer pre-cleaning procedure. As shown in FIG. 2, the pre-clean chamber 2 includes a radio frequency (RF) generator 21, a bell-jar 22, a shield 23, and a pre-clean chamber body 24. When the pre-cleaning of a wafer 6 is going to be executed, the wafer 6 is transferred into the pre-clean chamber 2 by the robot arm 5. Then, as shown in FIG. 3, a gas such as argon is induced into the pre-clean chamber 2, which is then ionized into plasma using the RF wave from the RF generator 21. By impacting the plasma onto the wafer 6, etching removes chemical residue remaining on the wafer 6 surface. It also removes the thin layer of oxide, which is formed when the wafer 6 is exposed to atmosphere.

When the plasma impacting method completes the pre-cleaning of the wafer 6, the removal material further adheres to the bell-jar 22 and the shield 23. In this case, if the metallic film deposition procedure to be executed in the PVD device is a pre-metallic deposition procedure like Cobalt deposition process of gate manufacturing procedure, the essential surface ingredient of the wafer 6 to be pre-cleaned in the pre-clean chamber 2 is silicon, as usual. Therefore, after multiple pre-cleaning procedures, a large amount of silicon-rich oxide will accumulate on the bell-jar 22 and the shield 23.

Since the bell-jar 22 is generally made of quartz and the adherent effect between the silicon-rich oxide and the quartz is poor, a peeling phenomenon occurs leading to particle contamination on the wafer 6 in the pre-clean chamber 6. Therefore, any subsequent metallic film manufacturing procedure will be inversely affected.

To resolve the above-mentioned problem, a manufacturer, usually, will clean the bell-jar 22 after a certain period of time to avoid the particle problem caused by the peeling of silicon-rich oxide from the bell-jar 22.

However, the manufacturing procedure must be suspended during the cleaning period and thus production efficiency is inversely affected. Therefore, it is an important objective to prevent rapidly the peeling of silicon-rich oxide and extend the life of the bell-jar 22 in the pre-clean chamber 2 so as to reduce time for maintenance and to promote production efficiency.

SUMMARY OF THE INVENTION

In view of the above, an objective of the invention is to provide a method for rapid preventing particles in a pre-clean chamber so as to extend the life of the bell-jar in the pre-clean chamber, to reduce the time required for maintenance, and thus to promote production efficiency.

The method for rapid preventing particles in a pre-clean chamber according to the invention is featured by impacting argon plasma onto a silica material to dislodge silica. The argon plasma is formed by using RF to ionize the argon gas and oxygen gas injected into the pre-clean chamber. The dislodged silica and ionized oxygen are allowed to co-deposit on a layer of silicon-rich oxide already formed on the bell-jar. A layer of silicon oxide formed with the dislodged silica could prevent the silicon-rich oxide from peeling quickly so as to extend the life of the bell-jar.

To achieve the objective of the invention, a method for rapid preventing particles in a pre-clean chamber according to the invention includes following steps:

a silica material supply step for providing a silica material in the pre-clean chamber;

a gas supply step for providing oxygen gas and sputtering gas into the pre-clean chamber; and a plasma generating step for ionizing the oxygen gas and the sputtering gas by RF to form plasma and then impacting the plasma onto the silica material, so that the silica dislodged from the silica material and the silicon-rich oxide react with the oxygen at a time so as to form a silica layer rapidly on the bell-jar in the pre-clean chamber.

As mentioned above, the adherence effect between silica and the bell-jar is better than that between silicon-rich oxide and the bell-jar. Thus, when a layer of silicon-rich oxide is formed on the bell-jar, silica can be generated rapidly via the reactions of oxygen gas and silicon-rich oxide, and oxygen gas and silica material. Coating silica on the bell-jar prevents the silicon-rich oxide from peeling quickly so as to extend the life of the bell-jar.

BRIEF DESCRIPTION OF THE DRAWINGS

These and other objects and advantages of the invention will become apparent by reference to the following description and accompanying drawings wherein.

DETAILED DESCRIPTION OF THE INVENTION

Hereafter, a concrete embodiment of the invention will be described in detail.

Figure 1:
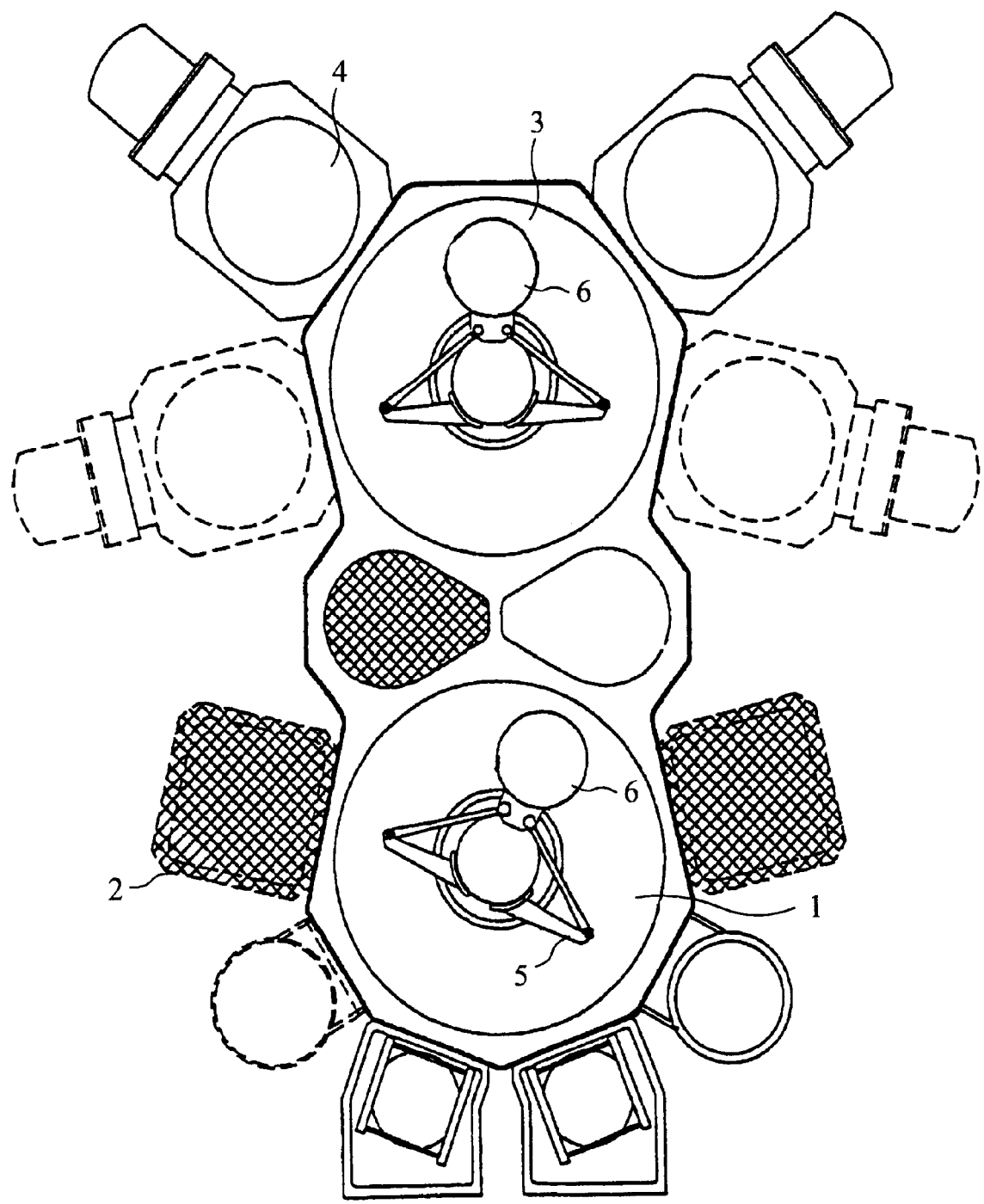
FIG. 1 is a schematic view showing the major parts of a conventional PVD device.
Figure 2:
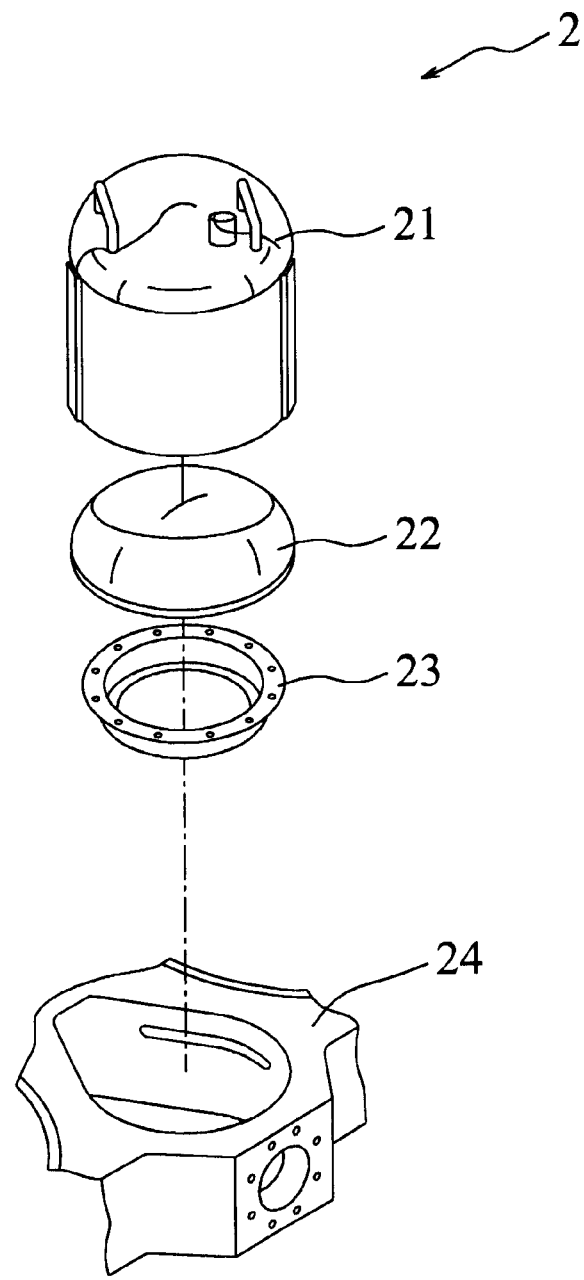
FIG. 2 is an exploded view showing the major parts a conventional pre-clean chamber.
Figure 3:
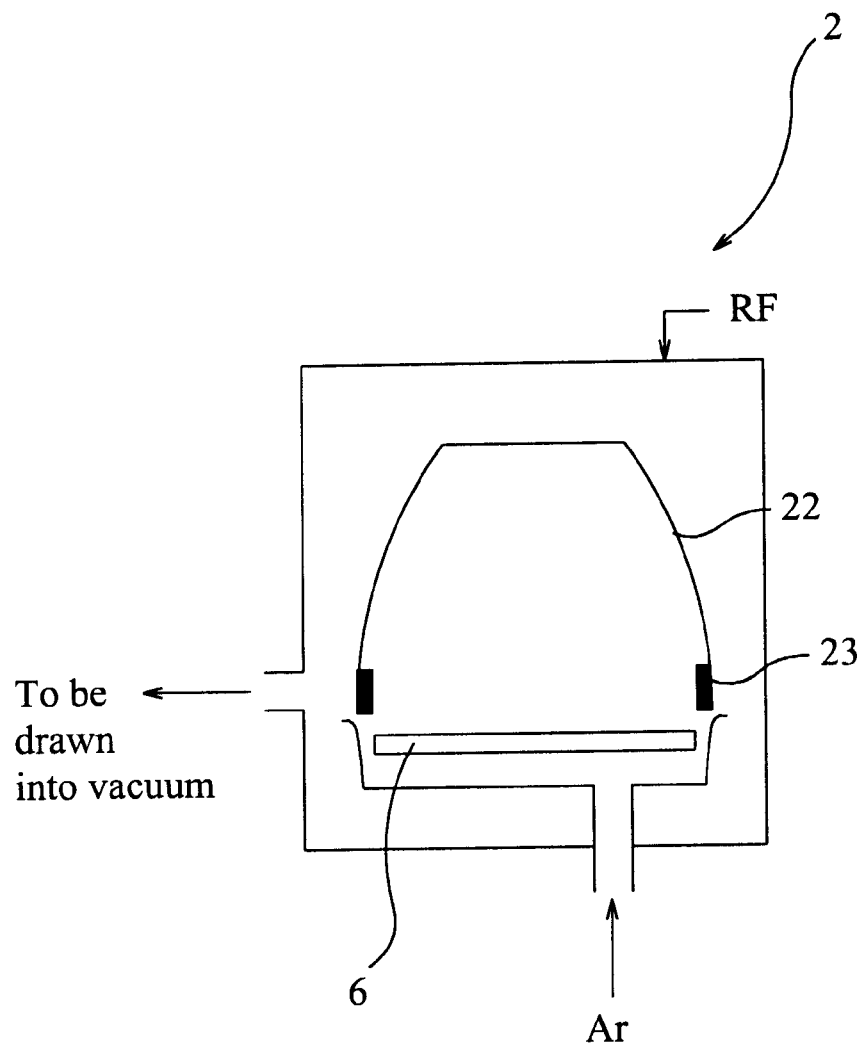
FIG. 3 is a schematic view showing the major parts of a conventional PVD device including a pre-clean chamber.

In order to conveniently describe the method and avoid redundant iteration, it should be previously pointed out that the reference numerals for illustrating the pre-clean chamber of a PVD device shown in FIG. 1, FIG. 2 and FIG. 3 continue to be used in this embodiment.

The method for rapid preventing particles in a pre-clean chamber according to the invention is used when a layer of silicon-rich oxide with a certain thickness is formed on a bell-jar of a pre-clean chamber of a PVD device.

The method for rapid preventing particles in a pre-clean chamber according to the invention includes a silica material supply step, a gas supply step and a plasma generating step.

Figure 4:
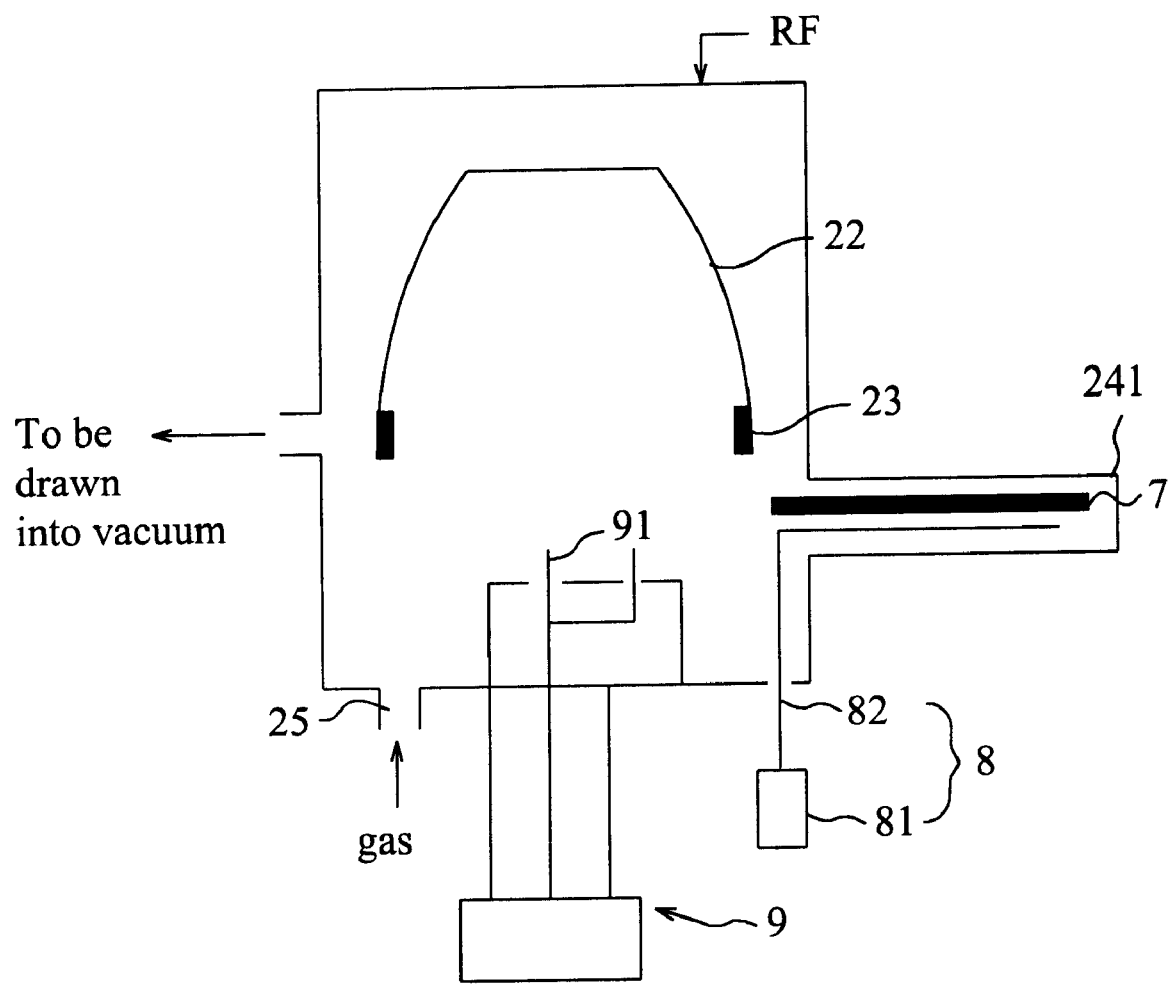
FIG. 4 is a schematic view showing the essential part of a PVD device employed in one embodiment of the method for rapid preventing particles in a pre-clean chamber according to the invention.

In the silica material supply step, the silica material can be supplied by employing the PVD device shown in FIG. 4. With reference to FIG. 4, a pre-receiving chamber 241 capable of receiving a silica material 7 in advance is provided on the side wall of the pre-clean chamber body 24 of the PVD device. In this embodiment, the silica material 7 is of plate-like form. The plate-like silica material 7 can be positioned on a bracket 91 of a lift 9 through driving mechanism 8.

More particularly, the driving mechanism 8 includes a carrier portion 82 and a motive portion 81. When the motive portion 81 is activated, the carrier portion 82 will be rotated to shift the silica material 7 from the carrier portion 82 to the bracket 91 of the lift 9. In addition to supplying the silica material 7 by the method associated with the device shown in FIG. 4, the silica material 7 can be mixed with the wafer 6 previously in a boat (not shown) and then be moved to the pre-clean chamber 2 by the robot arm 5.

Figure 5:
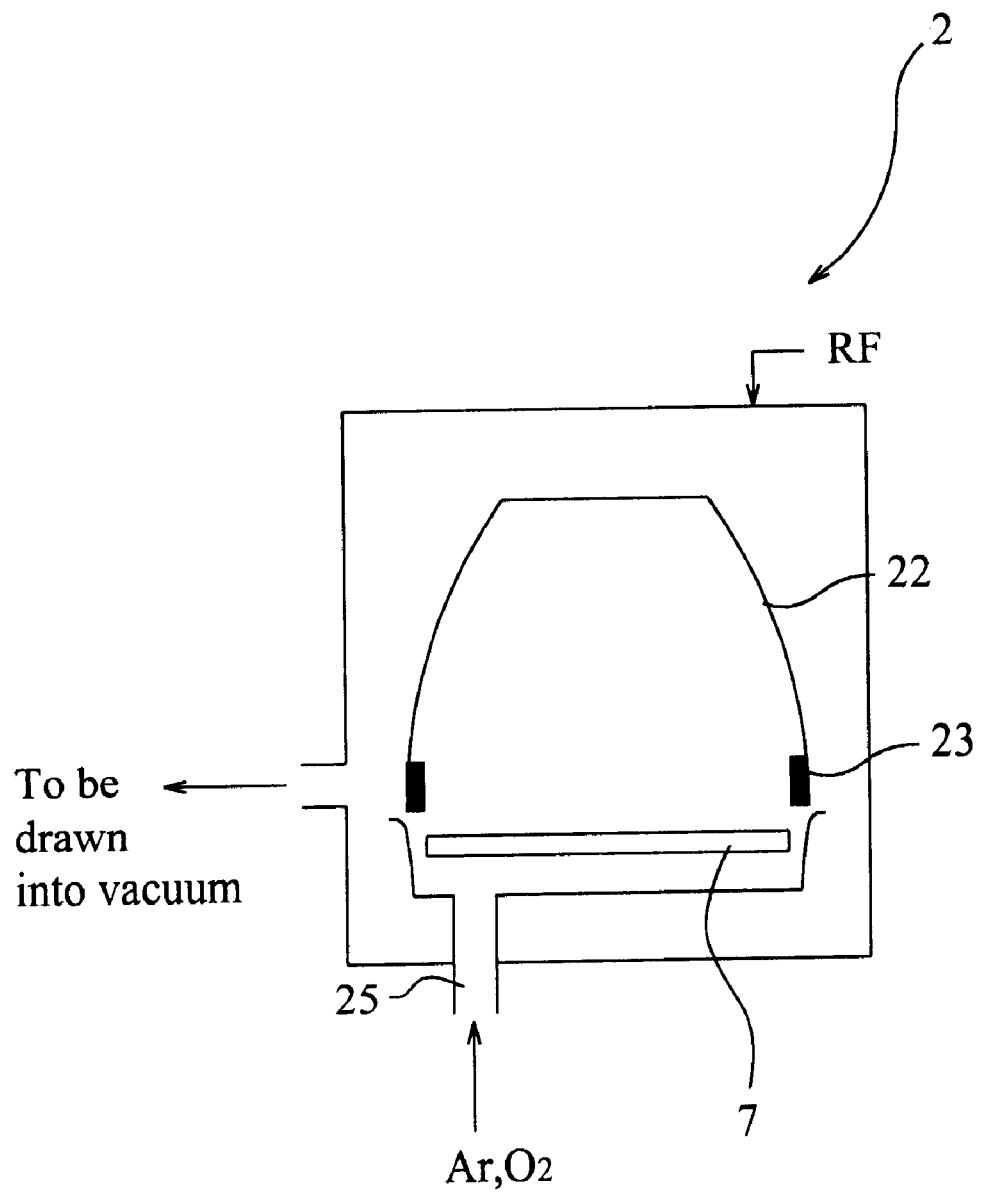
FIG. 5 is a schematic view showing the major parts of a PVD device including a pre-clean chamber employed in one embodiment of the method for rapid preventing particles in a pre-clean chamber according to the invention.

Afterward, the gas supply step is executed. In this step, as shown in FIG. 5, oxygen gas and sputtering gas are injected into the pre-clean chamber 2. Detailed description, oxygen gas and sputtering gas are injected into space of the bell-jar of the pre-clean chamber 2. In this case, sputtering gas is argon gas.

Moreover, as shown in FIG. 5, the plasma generating step is using RF to ionize the oxygen gas and sputtering gas in the pre-clean chamber 2. The plasma of sputtering gas impacts the silica material 7 so that the silica dislodged from the silica material and the silicon-rich oxide react with the oxygen at a time so as to form a silica layer rapidly on the bell-jar 22 in the pre-clean chamber 2.

In this case, RF is generated by the RF generator 21. Above all, the silica released from silica material 7 and it reacts with ionized oxygen gas quickly, so that the silicon oxide layer can be formed rapidly.

As described above, the adherence effect between silica and the bell-jar is better than that between silicon-rich oxide and the bell-jar. Thus, when a layer of silicon-rich oxide is formed on the bell-jar, silicon oxide can be generated rapidly by the reactions of plasma, argon gas and oxygen gas and silica material. Coating silicon oxide on the bell-jar prevents the silicon-rich oxide from peeling quickly so as to extend the life of the bell-jar and to reduce the maintenance time. Production efficiency is thus promoted.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A method for preventing particles in a pre-clean chamber, which is used in a pre-clean chamber having silicon-rich oxide, comprising:

a silica material supply step for providing a silica material in the pre-clean chamber;

a gas supply step for providing oxygen gas and sputtering gas into the pre-clean chamber; and a plasma generating step for ionizing the oxygen gas and the sputtering gas by RF to form plasma and then impacting the plasma onto the silica material, so that silica dislodged from the silica material and the silica react with the ionized oxygen gas at a time so as to form a silicon oxide layer on the bell-jar in the pre-clean chamber.

2. The method for preventing particles in a pre-clean chamber as claimed in claim 1, wherein the pre-clean chamber is a pre-clean chamber for a physical vapor deposition device.

3. The method for preventing particles in a pre-clean chamber as claimed in claim 1, wherein the silica material is provided in the pre-clean chamber prior to the plasma generating step.

4. The method for preventing particles in a pre-clean chamber as claimed in claim 1, wherein the pre-clean chamber includes a bell-jar and the silica dislodged from the silica material is sputtered on the bell-jar.

5. The method for preventing particles in a pre-clean chamber as claimed in claim 4, wherein the oxygen gas and the sputtering gas are supplied into the space of the bell-jar of the pre-clean chamber.

6. The method for preventing particles in a pre-clean chamber as claimed in claim 1, wherein the sputtering gas is argon gas.

7. The method for preventing particles in a pre-clean chamber as claimed in claim 5, wherein the sputtering gas is argon gas.

* * * * *